United States Patent
Carter et al.

(10) Patent No.: US 6,630,251 B1
(45) Date of Patent: Oct. 7, 2003

(54) LEACH-RESISTANT SOLDER ALLOYS FOR SILVER-BASED THICK-FILM CONDUCTORS

(75) Inventors: Bradley H. Carter, Kokomo, IN (US); Shing Yeh, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/252,502

(22) Filed: Sep. 23, 2002

(51) Int. Cl.[7] .................. B32B 15/01; B23K 1/00; B23K 1/19; H01L 29/12
(52) U.S. Cl. .............. 428/646; 428/645; 428/647; 428/648; 428/673; 228/262.9; 228/194; 148/528; 148/706; 148/707
(58) Field of Search ................ 428/646, 645, 428/647, 648, 673, 620; 228/262.9, 194; 148/528, 706, 707

(56) References Cited

U.S. PATENT DOCUMENTS

| | | | |
|---|---|---|---|
| 5,410,184 A | * | 4/1995 | Melton et al. ............ 257/772 |
| 5,607,099 A | * | 3/1997 | Yeh et al. ............ 228/180.22 |
| 5,803,340 A | * | 9/1998 | Yeh et al. ............... 228/56.3 |
| 5,938,862 A | | 8/1999 | Yeh et al. ............... 148/400 |
| 6,251,501 B1 | * | 6/2001 | Higdon et al. ............ 428/209 |
| 6,281,106 B1 | | 8/2001 | Higdon et al. ............ 438/613 |
| 6,375,062 B1 | | 4/2002 | Higdon et al. ............ 228/214 |
| 6,436,730 B1 | * | 8/2002 | Melton et al. ............ 438/108 |
| 6,476,332 B1 | * | 11/2002 | Shangguan ............ 174/261 |
| 6,570,260 B1 | * | 5/2003 | Yeh et al. ............... 257/778 |

* cited by examiner

Primary Examiner—John J. Zimmerman
Assistant Examiner—Jason Savage
(74) Attorney, Agent, or Firm—Jimmy L. Funke; Stefan V. Chmielewski

(57) ABSTRACT

A tin-lead solder alloy containing copper and/or nickel and optionally silver, palladium, platinum and/or gold as its alloying constituents. The solder alloy consists essentially of, by weight, about 5% to about 70% tin, up to about 4% silver palladium, platinum and/or gold, about 0.5% to about 10% copper and/or nickel, the balance lead and incidental impurities. The presence of copper and/or nickel in the alloy has the beneficial effect of inhibiting the dissolution and leaching of silver from a silver-containing thick-film, such as a conductor or solder pad, into the molten solder alloy during reflow. In addition, solder joints formed of the solder alloy form a diffusion barrier layer of intermetallic compounds that inhibit solid-state interdiffusion between silver from a silver-containing thick-film and tin from the solder joint.

31 Claims, 3 Drawing Sheets

LEACH-RESISTANT SOLDER ALLOYS FOR SILVER-BASED THICK-FILM CONDUCTORS

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to solder compositions of the type used in microelectronic applications. More particularly, this invention relates to tin-lead-based solder alloys used on silver-containing thick-film conductors, and which inhibit leaching of silver from such conductors, thereby improving adhesion and reliability of the solder-conductor joint.

(2) Description of the Related Art

FIGS. 1 and 2 represent a cross-section through an electronic assembly before and after, respectively, a solder reflow operation performed to attach an electronic component 10 to thick-film conductors 18 on a substrate 14, which may be formed of alumina or another material suitable for hybrid circuit applications. In FIG. 1, the solder material is in the form of a paste 11, while in FIG. 2 the solder paste 11 has been reflowed to form a solder joint 12. The solder joint 12 bonds and electrically connects a solder pad 16 on the component 10 to the thick-film conductor 18 on the substrate 14, thereby electrically and mechanically connecting the component 10 to the substrate 14. The pad 16 may be formed of aluminum on which an under bump metallurgy (UBM) is deposited, or formed of a silver-containing thick film material. The component 10 may be a chip capacitor, chip resistor, varistor, bare integrated circuit (IC), flip chip, packaged IC, etc.

Silver-containing thick-film compositions such as 20Ag/1Pd/0.3Pt and 99Ag/1Pt (parts by weight) are widely used as the conductor 18 for hybrid circuit applications. Silver is a good conductor and relatively low cost compared to other noble metals, particularly palladium. However, silver can rapidly dissolve in molten solder alloys, as represented in FIG. 2 in which the conductor 18 is significantly thinner than its pre-reflow condition. Silver dissolution (or silver leaching) can cause the solder to de-wet from the damaged or missing conductor land pattern. Palladium has been added in the weight ratio of about 3:1 Ag/Pd (i.e., about 25 weight percent palladium) to reduce this leaching effect. Higher amounts of palladium are more effective, with a palladium content of about 35 weight percent reportedly reducing the dissolution rate by half. However, as the cost of palladium has increased, the material cost for AgPd conductors has become more expensive. As a result, AgPd compositions containing 25 weight percent or less palladium are more widely used in the electronics industry.

Solders used in conjunction with thick-film conductors are generally (by weight) the eutectic Sn—37Pb, the near-eutectic Sn—40Pb alloy and the eutectic Sn—36Pb—2Ag. These alloys are typically reflowed at peak temperatures of about 205° C. to about 240° C. for assembly in automotive hybrid electronics. In some cases, a peak reflow temperature of as high as about 260° C. may be required. An example is an assembly using an In—50Pb solder alloy for flip chip bumps (not shown) and Sn—40Pb solder alloy for the solder joint 12 of other components on the substrate 14. Under these circumstances, a dual-reflow process may be used during board assembly. However, disadvantages with dual-reflow processes include higher costs, longer processing times, and the potential for flip chip damage. To process an assembly with these solder alloys using a single reflow operation, a peak reflow temperature of about 250° C. to about 260° C. is required. At these temperatures, severe silver leaching has been observed with Sn—40Pb component solder joints, resulting in reduced reliability or costly production loss. The presence of silver in a solder joint has the ability to slow the leaching rate of silver from a thick-film conductor to which it is bonded. However, additions of about 2 weight percent silver (e.g., the Sn—36Pb—2Ag alloy) and about 2.5 weight percent silver (e.g., Sn—95Pb—2.5Ag) have been found to be inadequate to prevent leaching and solid-state interdiffusion in circuits used in the automotive industry, which require elevated solder reflow temperatures and harsh accelerated testing. Silver leaching and solid-state interdiffusion can be more effectively reduced with a diffusion barrier, such as an electroless nickel layer, deposited on a silver-containing thick-film conductor. However, the added processing cost and complexity associated with a discrete barrier layer are undesirable.

Because the dissolution of silver out of thick-film conductors with a relatively high silver content can cause reliability problems, the reflow process (peak temperature and time above liquidus), conductor area, and conductor thickness are critical to reliability. It would be desirable if silver leaching from thick-film conductors could be prevented to improve product reliability without increasing processing and material costs, and with the potential for simplified processing.

BRIEF SUMMARY OF THE INVENTION

The present invention is directed to a tin-lead solder alloy containing copper and/or nickel, and optionally silver, palladium, platinum and/or gold as its alloying constituents. Thie solder alloy consists essentially of, by weight, about 5% to about 70% tin, about 0.5% to about 10% of copper and/or nickel, up to about 4% silver, palladium, platinum and/or gold, the balance lead and incidental impurities. According to the invention, the presence of copper and/or nickel in a tin-lead solder alloy has the beneficial effect of inhibiting the dissolution and leaching of silver from a silver-containing thick-film conductor into the molten solder alloy during reflow, which would lead to thinning or even complete dissolution of the conductor. In addition, solder joints formed of the solder alloy form a diffusion barrier layer of CuSn and/or NiSn intermetallic compounds (IMC's) at the interface between the solder joint and conductor, which inhibits solid-state interdiffusion between silver from the conductor and tin from the solder joint. Notably, each of these features of the invention are achieved regardless of silver content in the solder alloy, such that silver is an optional constituent of the alloy.

Certain solder alloys of this invention appear to be eutectic and therefore characterized by a true melting temperature, while others are noneutectic and therefore characterized by distinct solidus and liquidus temperatures. The noneutectic alloys have a solidus temperature near the melting temperatures of the eutectic alloys, and may have a liquidus temperature of up to about 470° C. However, the melting mechanism exhibited by the noneutectic alloys is such that they are substantially all melted within a narrow temperature range, and therefore are said to have an "effective melting temperature" in which the alloys behave similarly to the eutectic alloys even though their actual liquidus temperatures are considerably higher. Alloys of this invention containing up to 10 weight percent copper have been shown to reflow at temperatures much lower than their actual liquidus temperatures, to the extent that these compositions can be treated as requiring peak reflow temperatures of as low as 205° C., yet can be suitably reflowed at temperatures of as high as 260° C. without causing excessive leaching of silver.

Other objects and advantages of this invention will be better appreciated from the following detailed description.

DETAILED DESCRIPTION OF THE INVENTION

The invention is an improvement over SnPb and SnPbAg-based solder alloys typically used to attach surface-mount devices in hybrid circuit assemblies. The improved solder alloy contains copper and/or nickel in an amount sufficient to inhibit the dissolution of silver from a silver-containing thick-film conductor into the molten alloy during solder reflow, which is a known reliability issue because of thinning or complete dissolution of the conductor. Increased reliability from the suppression of silver dissolution is achieved even where peak reflow temperatures of about 260° C. are employed. Following reflow, the improved solder alloy continues to maintain joint reliability as a result of forming IMC precipitates that inhibit solid-state interdiffusion between the solder joint and the conductor. More specifically, the IMC precipitates form a layer at the joint-conductor interface that slows the interdiffusion of silver from the silver-containing conductor and tin from the solder joint, the result of which would lead to loss of adhesion between the conductor and the underlying substrate.

Figure 1:
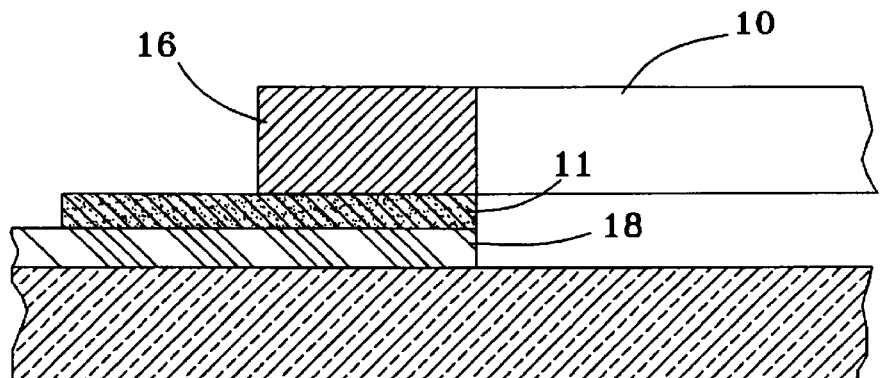
FIG. 1 represents a cross-sectional view of an electronic assembly immediately prior solder reflow.
Figure 2:
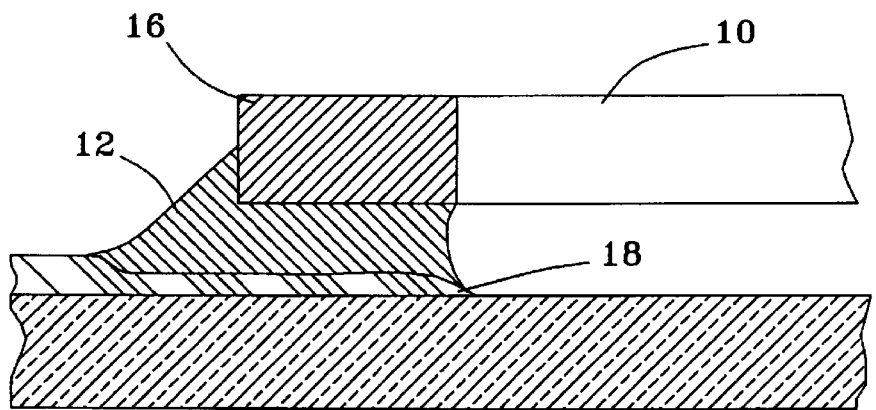
FIG. 2 represents a cross-sectional view of a solder joint connection resulting from reflow of the assembly of FIG. 1 when using prior art solder alloys.
Figure 3:
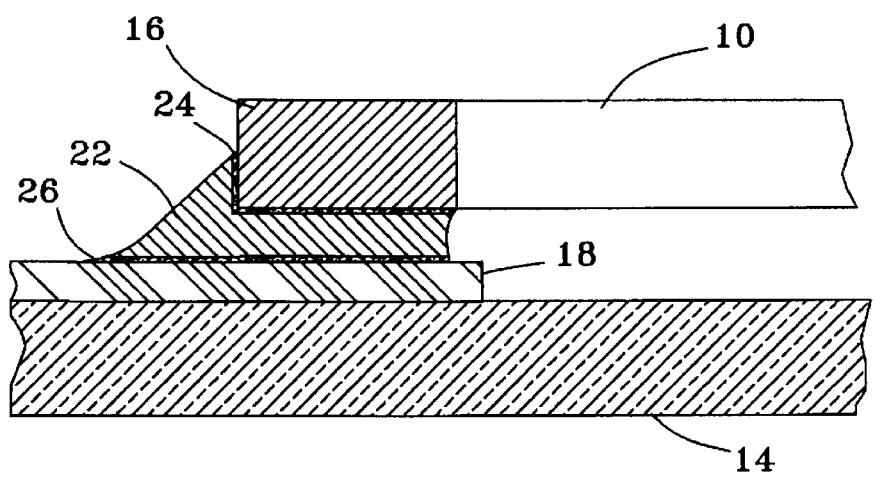
FIG. 3 represents a cross-sectional view of a solder joint connection resulting from reflow of the assembly of FIG. 1 when using a solder alloy in accordance with the present invention.

FIG. 3 represents a solder joint 22 formed when a solder alloy of this invention is used in the circuit assembly represented in FIG. 1. When comparing FIG. 3 to prior art FIG. 2, one can see that the silver-containing conductor 18 in FIG. 3 has not been thinned or otherwise depleted of silver as a result of the solder joint 22 containing a sufficient amount of copper or nickel to prevent silver leaching during reflow. FIG. 3 also represents IMC precipitates formed by the solder alloy of this invention as having precipitated along the interface between the solder joint 22 and the thick-film conductor 18, as represented by the thin IMC layer 26 in FIG. 3, as well as within the bulk of the solder joint 22 and at the interface of the solder joint 22 with the solder pad 16, as represented by the thin IMC layer 24 in FIG. 3. The result is effectively a diffusion barrier that has been determined to inhibit solid-state interdiffusion of silver from the conductor 18 and tin from the solder joint 22 (and/or solid-state interdiffusion of tin from the solder joint 22 and silver from the pad 16, if formed of a silver-bearing material) during high temperature exposures that may occur during subsequent assembly processing and service.

The above benefits made possible with this invention have been achieved with SnPb-based alloys containing, by weight, at least 0.5% to about 10% copper and optionally up to about 4% silver. The remainder of the alloy composition is, by weight, about 5% to about 70% tin, the balance lead and incidental impurities. According to the invention, nickel is believed to be a suitable substitute for some or all of the copper content in the alloy because of the similar physical and chemical properties that nickel exhibits in soldering applications. In addition, palladium, platinum and/or gold are believed to be suitable as substitute(s) for any silver content in the alloy. If copper is the chosen additive for inhibiting silver dissolution and solid-state interdiffusion, nickel may be present as a substitute for silver, palladium, platinum and/or gold in the solder alloy.

Two eutectic or near-eutectic compositions, Sn—36Pb—2Cu and Sn—35Pb—2Ag—2Cu, have been identified within the above noted compositional ranges. Each of these compositions are characterized by melting temperatures of about 183.0° C. and 178.3° C., respectively, and therefore the same or very near the melting temperatures of eutectic Sn—37Pb (183.0° C.) and Sn—36Pb—2Ag (178.8° C.). Other alloys within the above compositional ranges are noneutectic and therefore characterized by distinct solidus and liquidus temperatures. The noneutectic alloys have a solidus temperature near the melting temperatures of the eutectic alloys, but have liquidus temperatures well in excess of the peak reflow temperature of 250° C. required for many reflow processes. Nonetheless, with the exception of their IMC's, noneutectic alloys of this invention containing as much as 10 weight percent copper have been demonstrated to melt within a very narrow temperature range near their solidus temperatures. With very careful examination of differential scanning calorimetry (DSC) data for these alloys, their actual liquidus temperatures have been identified as occurring at temperatures of up to about 470° C., depending on copper content. However, the amount and distribution of the IMC's allow the alloys of this invention to reflow within an "effective" melting range that permits the use of peak reflow temperatures of as low as 205° C. up to about 260° C., depending on alloy composition. As such, alloys of this invention can be reflowed at peak temperatures suitable for a variety of hybrid circuit applications.

For SnPb and SnPbAg alloys containing copper in accordance with this invention, two CuSn IMC's, $Cu_6Sn_5$ and $Cu_3Sn$, have been identified above the solidus temperatures of the alloys. Because of the compositions and very limited amounts of these IMC's, their dissolution/melting in the alloys is not readily apparent unless the melting behavior of the alloy is very carefully examined. In any event, investigations leading to this invention have shown that SnPb and SnPbAg alloys containing up to 10 weight percent copper reflow at temperatures much lower than their actual liquidus temperatures, to the extent that these compositions can be treated as eutectic compositions with very small amounts of $Cu_6Sn_5$ or $Cu_3Sn$ IMC particles suspended in the liquid solder during reflow. However, alloys of this invention contain a sufficient amount of copper such that CuSn IMC's precipitate out to form the IMC layer 26 at the interface between the solder joint 22 and conductor 18 (FIG. 3), as well as at the solder-pad interface (layer 24) and within the bulk of the solder joint 22. Likewise, if nickel is present alone or in combination with copper in the solder alloys of this invention, the IMC layers 24 and 26 and the bulk of the solder joint 22 will contain nickel IMC's precipitates, presumably $Ni_3Sn_4$ or $Ni_3Sn_2$, depending on the nickel concentration.

Figure 4:
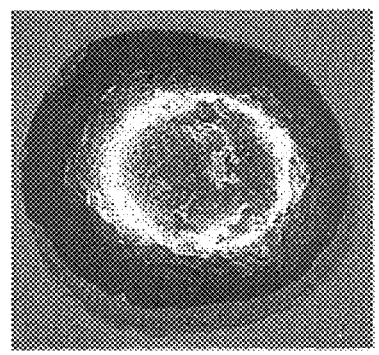
FIGS. 4 through 7 are scanned images of surfaces of silver-containing thick-film conductors on which SnPb-based solders were reflowed, and are representative of the presence and absence of damage caused by silver leaching during reflow.
Figure 5:
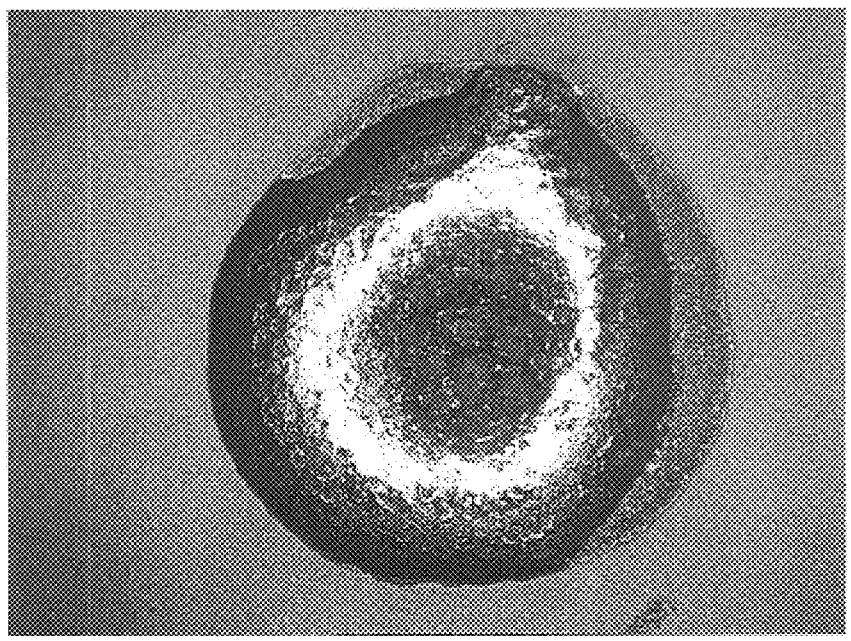
Figure 6:
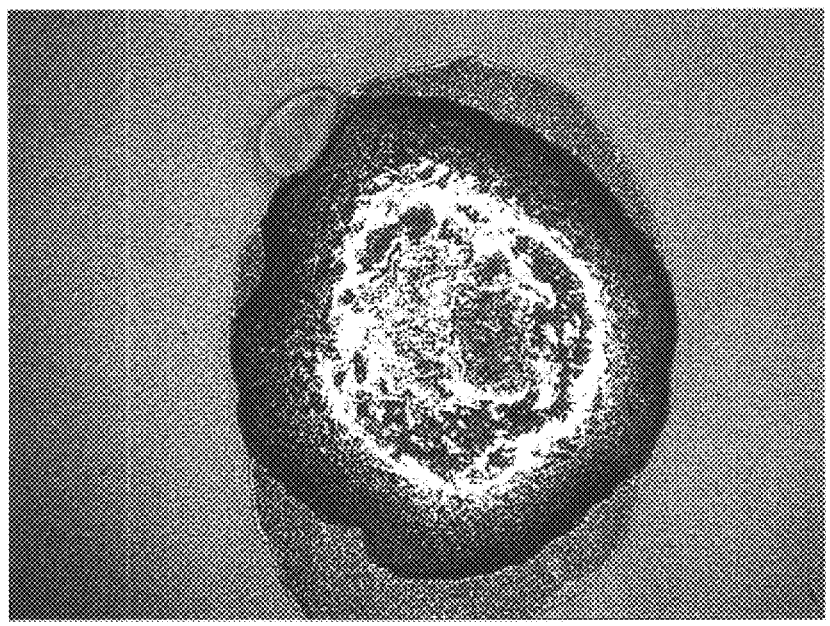
Figure 7:
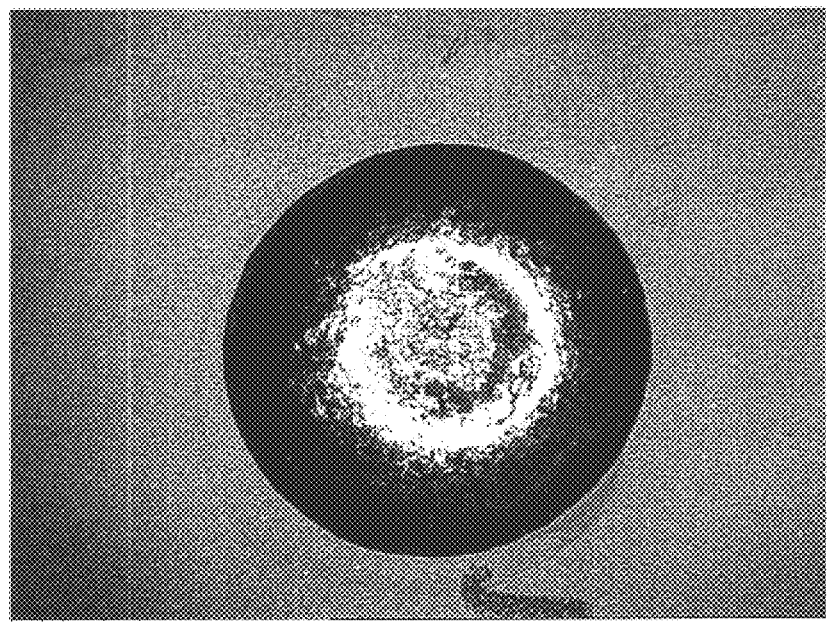

In a first investigation leading to this invention, a reflow leaching experiment was performed to evaluate the effect of adding copper to the eutectic Sn—37Pb and Sn—36Pb—2Ag alloys in terms of de-wetting and leaching damage sustained by silver-containing thick-film conductors. The conductor materials evaluated were commercially available 20Ag/1Pd/0.3Pt and 3Ag/1Pd (reported in parts by weight), and had fired thicknesses of about 12 micrometers. The Sn—37Pb and Sn—36Pb—2Ag solder alloys were evaluated as baselines, while experimental compositions were formulated by modifying these alloys to contain copper at levels of, by weight, about 0.35%, 0.7%, 1.0%, 1.25%, 0.5%, 1.75%, 2.0%, 2.25%, 2.5%, 2.75%, 3.0% 3.25% and 3.5%. The solder alloys were deposited and then reflowed on the conductors at peak temperatures of 235° C., 260° C. or 278° C. FIGS. 4 and 5 show visible leaching damage on a 20Ag/1Pd/0.3Pt conductor caused by reflowing the baseline Sn—37Pb and Sn—36Pb—2Ag solder alloys at 235° C. peak reflow. FIG. 6 shows that visible leaching damage also occurred when reflowing the experimental Sn—37Pb—0.35Cu alloy on a 20Ag/1Pd/0.3Pt conductor at 235° C. peak reflow. However, no leaching damage occurred when reflowing experimental solder alloys containing 0.7% or more of copper on a 20Ag/1Pd/0.3Pt conductor at 235° C. peak, as seen in FIG. 7.

Results of the reflow leaching tests performed on the 20Ag/1Pd/0.3Pt and 3Ag/1Pd conductors are summarized below in Tables I and II, respectively. FIGS. 4, 5 and 6 are representative of those conductors indicated in Tables I and II as being leach-damaged ("Damage"), which in the most severe cases coincided with the solder completely de-wetting from the conductor and forming a solder ball. In contrast, FIG. 7 is representative of those conductors indicated in Tables I and II as being free of leaching damage ("OK"), each of which was achieved with a copper-containing SnPb solder alloy of this invention.

TABLE I

20 Ag/1 Pd/0.3 Pt Conductors

| | REFLOW TEMP. | | |
|---|---|---|---|
| | 235° C. | 260° C. | 278° C. |
| Sn—37Pb | Damage | Damage | Damage |
| Sn—36Pb—2Ag | Damage | Damage | Damage |
| Sn—37Pb + | | | |
| 0.35% Cu | Damage | Damage | Damage |
| 0.70% Cu | OK | Damage | Damage |
| 1.00% Cu | OK | OK | Damage |
| 1.25% Cu | OK | OK | OK |
| 1.50% Cu | OK | OK | OK |
| 1.75% Cu | OK | OK | OK |
| 2.00% Cu | OK | OK | OK |
| 2.25% Cu | OK | OK | OK |
| 2.50% Cu | OK | OK | OK |
| 3.00% Cu | OK | OK | OK |
| 3.50% Cu | OK | OK | OK |

TABLE II

3 Ag/1 Pd Conductors

| | REFLOW TEMP. | | |
|---|---|---|---|
| | 235° C. | 260° C. | 278° C. |
| Sn—37Pb | OK | Damage | Damage |
| Sn—36Pb—2Ag | OK | Damage | Damage |
| Sn—37Pb + | | | |
| 0.35% Cu | OK | Damage | Damage |
| 0.70% Cu | OK | OK | Damage |
| 1.00% Cu | OK | OK | Damage |
| 1.25% Cu | OK | OK | Damage |
| 1.50% Cu | OK | OK | Damage |
| 1.75% Cu | OK | OK | Damage |
| 2.00% Cu | OK | OK | OK |
| 2.25% Cu | OK | OK | OK |
| 2.50% Cu | OK | OK | OK |
| 3.00% Cu | OK | OK | OK |
| 3.50% Cu | OK | OK | OK |

From the above, it can be seen that 20Ag/1Pd/0.3Pt conductors were more susceptible to leaching damage than were the more expensive 3Ag/1Pd conductors, and that higher amounts of copper were required to prevent leaching damage in conductors with lower palladium contents and with increasing reflow temperatures. More particularly, leaching damage occurred when reflow was performed on 20Ag/1Pd/0.3Pt conductors at 235° C. unless greater than 0.35% copper was present in the solder alloy. When reflow was performed at a peak temperature of 260° C., greater than 0.7% copper was required to avoid leaching damage, while greater than 1% copper was required to avoid leaching damage when reflow was performed at 278° C. While the 3Ag/1Pd conductors were significantly less susceptible to leaching damage, damage nonetheless occurred when reflow temperatures above 235° C. were used. With a reflow temperature of 260° C., greater than 0.35% copper was required to avoid leaching damage, while greater than 1.75% copper was required to avoid damage at the 278° C. peak reflow temperature. Notably, leaching damage did not appear to be significantly affected by 2% silver content of the Sn—36Pb—2Ag solder, such that silver was concluded to be an optional constituent of the copper-containing solder alloys of this invention.

A reflow experiment and DSC analysis were used to determine the maximum allowable copper content that can be incorporated into the eutectic SnPb and eutectic SnPbAg alloys without negatively impacting peak reflow temperature. The reflow experiment was conducted with ingots of SnPbCu and SnPbAgCu alloys prepared by adding copper to the molten eutectic Sn—37Pb alloy and molten eutectic Sn—36Pb—2Ag alloy to attain copper levels of up to about 20 weight percent. The molten alloys were heated above about 500° C. for about 30 minutes to ensure complete alloying of all elements. Small pieces were then cut from the resulting ingots, placed on ceramic substrates, fluxed with a Type RMA flux, and then run through a reflow oven with a peak reflow temperature of either about 215° C. or about 250° C. The reflow profile used was typical for circuit assembly processes using the eutectic Sn—37Pb and Sn—36Pb—2Ag solder alloys.

At reflow temperatures of about 215° C., the baseline eutectic alloys and those alloys modified to contain up to 4 weight percent copper were observed to reflow completely, forming characteristic spherical solder balls, while alloys containing 6 weight percent copper or more did not fully reflow. At reflow temperatures of about 250° C., the baseline eutectic alloys and those alloys modified to contain up to 10 weight percent copper were observed to reflow completely, again forming characteristic spherical solder balls, while alloys containing 12 weight percent copper or more did not fully reflow. The solidus and liquidus temperatures of ingots containing up to about 10 weight percent copper were determined by DSC analysis conducted to about 500° C., the results of which are summarized in Table III below.

TABLE III

| Alloy | Solidus (° C.) | Liquidus (° C.) |
|---|---|---|
| 63Sn—37Pb (baseline) | 183.0 | 183.0 |
| 62Sn—36Pb—2Cu | 183.0 | 183.0 |
| 61Sn—35Pb—4Cu | 180.6 | 337.1 |
| 59Sn—35Pb—6Cu | 181.3 | 336.3 |
| 58Sn—34Pb—8Cu | 182.0 | 456.0 |
| 57Sn—33Pb—10Cu | 184.6 | 470.0 |
| 62Sn—36Pb—2Ag (baseline) | 178.8 | 178.8 |
| 61Sn—35Pb—2Ag—2Cu | 178.3 | 178.3 |
| 60Sn—34Pb—2Ag—4Cu | 178.7 | 329.0 |
| 58Sn—34Pb—2Ag—6Cu | 177.5 | 326.0 |
| 57Sn—33Pb—2Ag—8Cu | 177.8 | (324.8)* |
| 56Sn—32Pb—2Ag—10Cu | 178.0 | (324.8)* |

*The liquidus temperatures of these alloys may be above 500° C., which was the upper limit of the DSC analysis range.

All of the copper-containing alloys exhibited a very narrow melting range around either 183° C. or 179° C., which are the melting temperatures for the eutectic SnPb and SnPbAg alloys, respectively. With the addition of about 4 weight percent copper, a small peak appeared in the DSC curves at around 330° C. to 340° C. Progressively larger peaks were observed with alloys containing increasingly higher copper contents. It was concluded that these peaks were from the melting of the CuSn IMC's in the bulk of the solder alloy. For copper additions of about 2 to 6 weight percent, the predominate IMC in the pro-eutectic phase was $Cu_6Sn_5$, while $Cu_3Sn$ began to appear with copper additions above 6 weight percent, yielding a mixture of $Cu_6Sn_5$ and $Cu_3Sn$ in the pro-eutectic phase.

The above results are contrary to the conventional wisdom that the peak reflow temperature must be 20° C. to 50° C. above the liquidus temperature of the solder alloy. For example, the 61Sn—35Pb—4Cu alloy was determined by DSC analysis to have a liquidus temperature of 337.1° C., yet the sample of this alloy was found to reflow completely at 215° C. Similarly, the 56Sn—32Pb—2Ag—10Cu alloy was determined to have a liquidus temperature of 324.8° C., yet was found to reflow completely at 250° C. As evident from the DSC charts, only a trace amount of CuSn IMC's existed above the melting temperatures of the SnPb and SnPbAg eutectic compositions. The amounts of the CuSn IMC's were very limited and quantitative analysis could not be performed accurately. It was concluded that the small amounts of CuSn IMC's could explain why alloys containing up to 10 weight percent copper could be reflowed at temperatures far below their liquidus temperatures. For practical purposes, all of the copper-containing compositions tested could be treated as eutectic compositions with very small amounts of $Cu_6Sn_5$ or $Cu_3Sn$ IMC particles suspended in the liquid solder during reflow at a peak temperature between 205° C. and 250° C. In other words, molten solder characteristics such as wetting, surface tension, etc., are believed to be essentially unchanged under industry-standard reflow conditions.

Based on the above, the solubility of silver, a major component of thick-film conductors, in liquid SnPb-based solders was shown to be a function of temperature and copper concentration, with solubility being greatly reduced by increasing copper concentrations such that silver leaching from a silver-containing conductor during reflow is significantly inhibited. Based on metallurgical examinations of solder joints formed from copper-containing SnPb and SnPbAg solder alloys, copper was determined to precipitate out as CuSn intermetallic compounds along the interface between the solder joint and conductor. This CuSn intermetallic layer was concluded to act as a diffusion barrier that significantly slows solid-state interdiffusion during high temperature exposures, as would occur during field service as well as accelerated reliability testing. By inhibiting solid-state interdiffusion, delamination of a silver-containing conductor is prevented, thus increasing the reliability of the solder joint.

Based on those alloys evaluated, it was concluded that copper contents of as low as about 0.5 weight percent should be capable of preventing silver leaching from AgPd-based conductors containing less than 25 weight percent palladium (e.g., 20Ag/1Pd/0.3Pt) if peak reflow temperatures below 260° C. are used. Increasing reflow temperatures require higher copper contents, though the required copper increase can be partially offset if an AgPd-based conductor containing at least about 25 weight percent palladium (e.g., 3Ag/1Pd) is used. Furthermore, copper levels as high as about 10 weight percent are believed to exhibit suitable reflow characteristics at peak temperatures of as high as 278° C. Because leaching damage did not appear to be significantly affected by silver content, silver in amounts of up to 4 weight percent was concluded to be an optional constituent of the copper-containing solder alloys of this invention. The following are examples of solder alloys believed to be particularly useful based on the above investigation.

| Alloy | Reflow Range |
|---|---|
| 62Sn—37Pb—1Cu | 210–235° C. |
| 62Sn—36Pb—2Cu | 210–235° C. |
| 25Sn—73Pb—2Cu | 290–310° C. |
| 10Sn—88Pb—2Cu | 330–350° C. |
| 5Sn—93Pb—2Cu | 330–350° C. |

While the invention has been described in terms of a preferred embodiment, it is apparent that other forms could be adopted by one skilled in the art. For example, while the investigation focused on additions of copper, nickel is believed to be a suitable substitute for some or all of the copper content in the alloy because of the similar physical and chemical properties that nickel exhibits in soldering applications. In addition, though alloys containing silver were investigated, palladium, platinum and/or gold are believed to be suitable as substitute(s) for any silver content in the alloy. Furthermore, if the alloy contains copper for the purpose of inhibiting silver dissolution and solid-state interdiffusion, nickel may yet be present as a substitute for silver, palladium, platinum and/or gold in the solder alloy. Accordingly, the scope of the invention is to be limited only by the following claims.

What is claimed is:

1. An electronic assembly comprising a solder joint bonded to a silver-containing thick-film, the solder joint being formed of a solder alloy consisting essentially of, by weight, about 5% to about 70% tin, up to about 4% silver, palladium, platinum and/or gold, copper and/or nickel in a total amount of greater than 1% to about 10%, the balance lead and incidental impurities, the amount of copper and/or nickel in the solder alloy inhibiting leaching of silver from the thick-film during forming of the solder joint by reflow, the solder joint comprising a diffusion barrier layer of CuSn and/or NiSn intermetallic compounds at an interface between the solder joint and the thick-film, the diffusion barrier layer inhibiting solid-state interdiffusion between silver from the thick-film and tin from the solder joint.

2. A electronic assembly according to claim 1, wherein the copper content is at least 1.25 weight percent of the solder alloy.

3. A electronic assembly according to claim 1, wherein the copper content is about 2 weight percent of the solder alloy.

4. A electronic assembly according to claim 1, wherein the solder alloy is essentially free of silver.

5. A electronic assembly according to claim 1, wherein the solder alloy consists essentially of, by weight, about 62% tin, about 2% copper, the balance lead and incidental impurities.

6. A electronic assembly according to claim 1, wherein the solder alloy consists essentially of, by weight, about 25% tin, about 2% copper, the balance lead and incidental impurities.

7. A electronic assembly according to claim 1, wherein the solder alloy consists essentially of, by weight, about 10% tin, about 2% copper, the balance lead and incidental impurities.

8. A electronic assembly according to claim 1, wherein the solder alloy consists essentially of, by weight, about 5% tin, about 2% copper, the balance lead and incidental impurities.

9. A electronic assembly according to claim 1, wherein the thick-film contains less than 25 weight percent palladium.

10. A electronic assembly according to claim 1, wherein the thick-film contains at least about 25 weight percent palladium.

11. A electronic assembly according to claim 1, wherein the solder joint is also bonded to an interconnect pad of a surface-mount device, the solder joint having a second diffusion barrier layer of intermetallic compound at an interface between the solder joint and the interconnect pad.

12. An electronic assembly comprising a solder joint bonded to a silver-containing thick-film conductor, the solder joint being formed of a solder alloy consisting essentially of, by weight, 5% to 62% tin, greater than 1% to 10% copper, 37% to 93% lead, up to about 4% silver, nickel, palladium, platinum and/or gold, and incidental impurities, the amount of copper in the solder alloy inhibiting leaching of silver from the conductor during forming of the solder joint by reflow, the solder joint comprising a diffusion barrier layer of CuSn intermetallic compound at an interface between the solder joint and the conductor, the diffusion barrier layer inhibiting solid-state interdiffusion between silver from the conductor and tin from the solder joint.

13. A electronic assembly according to claim 12, wherein the copper content is at least 1.25 weight percent of the solder alloy.

14. A electronic assembly according to claim 12, wherein the copper content is about 2 weight percent of the solder alloy.

15. A electronic assembly according to claim 12, wherein the solder alloy consists of, by weight, about 62% tin, about 2% copper, the balance lead and incidental impurities.

16. A electronic assembly according to claim 12, wherein the solder alloy consists of, by weight, about 25% tin, about 2% copper, the balance lead and incidental impurities.

17. A electronic assembly according to claim 12, wherein the solder alloy consists of, by weight, about 10% tin, about 2% copper, the balance lead and incidental impurities.

18. A electronic assembly according to claim 12, wherein the solder alloy consists of, by weight, about 5% tin, about 2% copper, the balance lead and incidental impurities.

19. A electronic assembly according to claim 12, wherein the conductor contains less than 25 weight percent palladium.

20. A electronic assembly according to claim 12, wherein the conductor contains at least about 25 weight percent palladium.

21. A method of forming an electronic assembly comprising a solder joint bonded to a silver-containing thick-film, the method comprising the steps of:
reflowing a solder alloy on the thick-film to form the solder joint, the solder alloy consisting essentially of, by weight, about 5% to about 70% tin, up to about 4% silver, palladium, platinum and/or gold, at least 0.5% to about 10% copper and/or nickel, the balance lead and incidental impurities, the copper and/or nickel content of the solder alloy inhibiting leaching of silver from the thick-film into the solder joint; and
cooling the solder alloy to form the solder joint, the solder joint comprising a diffusion barrier layer of CuSn and/or NiSn intermetallic compounds at an interface between the solder joint and the thick-film, the diffusion barrier layer inhibiting solid-state interdiffusion between silver from the thick-film and tin from the solder joint.

22. A method according to claim 21, wherein the thick-film contains less than 25 weight percent palladium.

23. A method according to claim 22, wherein the solder alloy is reflowed at a temperature of at least 235° C. and the copper content of the solder alloy is at least 0.7 weight percent.

24. A method according to claim 22, wherein the solder alloy is reflowed at a temperature of at least 260° C., and the copper content of the solder alloy is at least 1.0 weight percent.

25. A method according to claim 22, wherein the solder alloy is reflowed at a temperature of at least 278° C., and the copper content of the solder alloy is at least 1.25 weight percent.

26. A method according to claim 21, wherein the thick-film contains at least about 25 weight percent palladium.

27. A method according to claim 26, wherein the solder alloy is reflowed at a temperature of at least 260° C., and the copper content of the solder alloy is at least 0.7 weight percent.

28. A method according to claim 26, wherein the solder alloy is reflowed at a temperature of at least 278° C., and the copper content of the solder alloy is at least 2 weight percent.

29. A method according to claim 21, wherein the solder alloy is essentially free of silver.

30. A method according to claim 21, wherein the solder joint is also bonded to an interconnect pad of a surface-mount device, the solder joint having a second diffusion barrier layer of intermetallic compound at an interface between the solder joint and the interconnect pad.

31. A method of forming an electronic assembly comprising a solder joint bonded to a silver-containing thick-film conductor, the method comprising the steps of:
reflowing a solder alloy on the conductor to form the solder joint, the solder alloy consisting essentially of, by weight, about 5% to about 70% tin, up to about 4% silver, nickel, palladium, platinum and/or gold, at least 0.7% to about 10% copper, the balance lead and incidental impurities, the copper content of the solder alloy inhibiting leaching of silver from the conductor into the solder joint; and cooling the solder alloy to form the solder joint, the solder joint comprising a diffusion barrier layer of CuSn intermetallic compound at an interface between the solder joint and the conductor, the diffusion barrier layer inhibiting solid-state interdiffusion between silver from the conductor and tin from the solder joint;

wherein:

the copper content of the solder alloy is at least 1.0 weight percent if the solder alloy is reflowed at a temperature of at least 260° C. and the conductor contains less than 25 weight percent palladium;

the copper content of the solder alloy is at least 1.25 weight percent if the solder alloy is reflowed at a temperature of at least 278° C. and the conductor contains less than 25 weight percent palladium;

the copper content of the solder alloy is at least 0.7 weight percent if the solder alloy is reflowed at a temperature of at least 260° C. and the conductor contains at least 25 weight percent palladium; and the copper content of the solder alloy is at least 2.0 weight percent if the solder alloy is reflowed at a temperature of at least 278° C. and the conductor contains at least 25 weight percent palladium.

* * * * *